United States Patent
Kim et al.

(10) Patent No.: US 7,816,713 B2
(45) Date of Patent: Oct. 19, 2010

(54) CMOS IMAGE SENSOR HAVING THIOPHENE DERIVATIVES

(75) Inventors: Kyu-sik Kim, Yongin-si (KR);
Sang-cheol Park, Yongin-si (KR);
Young-jun Park, Yongin-si (KR);
O-hyun Kwon, Yongin-si (KR);
Jung-gyu Nam, Yongin-si (KR);
Hye-suk Jo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 12/053,740

(22) Filed: Mar. 24, 2008

(65) Prior Publication Data

US 2009/0090903 A1    Apr. 9, 2009

(30) Foreign Application Priority Data

Oct. 8, 2007    (KR)    ............ 10-2007-0100944

(51) Int. Cl.
*H01L 31/062* (2006.01)
(52) U.S. Cl. .................. 257/291; 257/40; 257/290; 257/292; 257/293; 257/E27.133; 257/E27.134; 257/E27.135
(58) Field of Classification Search .............. 257/40, 257/290, 291, 292, 293, E27.133, E27.134, 257/E27.135
See application file for complete search history.

(56) References Cited

U.S. PATENT DOCUMENTS

| 2005/0194653 | A1 | 9/2005 | Hynecek et al. | |
| 2005/0205903 | A1 | 9/2005 | Hioki | |
| 2006/0054987 | A1* | 3/2006 | Nii | 257/440 |
| 2007/0045618 | A1* | 3/2007 | Li et al. | 257/40 |
| 2007/0057339 | A1* | 3/2007 | Mitsui et al. | 257/432 |
| 2008/0035965 | A1* | 2/2008 | Hayashi et al. | 257/291 |
| 2008/0283881 | A1* | 11/2008 | Lee | 257/292 |

* cited by examiner

*Primary Examiner*—Andy Huynh
(74) *Attorney, Agent, or Firm*—Cantor Colburn LLP

(57) ABSTRACT

Provided is a CMOS image sensor that uses thiophene derivatives. The CMOS image sensor includes first through third photoelectric conversion units vertically and sequentially stacked on a semiconductor substrate. The first photoelectric conversion unit detects blue light and comprises a first electrode, a second electrode, and a p-type thiophene derivative layer between the first electrode and the second electrode.

10 Claims, 5 Drawing Sheets

US 7,816,713 B2

CMOS IMAGE SENSOR HAVING THIOPHENE DERIVATIVES

CROSS-REFERENCE TO RELATED PATENT APPLICATION

This application claims the benefit of Korean Patent Application No. 10-2007-0100944, filed on Oct. 8, 2007, in the Korean Intellectual Property Office, the disclosure of which is incorporated herein in its entirety by reference.

BACKGROUND OF THE INVENTION

1. Field of the Invention

The present invention relates to a vertical CMOS image sensor, and more particularly, to a CMOS image sensor that uses blue photoelectric conversion characteristics of a p-n junction body having an n-characteristic and a p-characteristic of thiophene derivatives.

2. Description of the Related Art

An image sensor is a photoelectric transducer that detects light and transforms the detected light into an electric signal. A conventional image sensor includes a plurality of unit pixels arranged in arrays on a semiconductor substrate. Each of the unit pixels includes a photodiode and transistors. The photodiode generates and stores optical charges by detecting external light. The transistors output electrical signals in response to the amount of optical charges generated from the photodiode.

A complimentary metal oxide semiconductor (CMOS) image sensor includes a photodiode that may receive and store optical signals, and may display an image using a control device that may control or process the optical signals. The CMOS image sensor has advantages in that it may be manufactured using a simple manufacturing process since the control device may be manufactured using a conventional CMOS manufacturing technique, and furthermore, the CMOS image sensor may be manufactured on one chip along with various signal processing devices.

In a conventional CMOS image sensor, the photodiode includes a color filter that transmits light of a particular wavelength. The color filter absorbs approximately ⅔ of light incident on the photodiode, and thus, the amount of light input to the photodiode is reduced, which may cause a reduction in sensitivity of the CMOS image sensor.

A CMOS image sensor that does not use a color filter has been disclosed in U.S. Patent Publication No. 2005/0194653. In this CMOS image sensor, vertically-stacked photodiodes generate electrical signals.

Also, a CMOS image sensor that does not use a color filter has been disclosed in U.S. Patent Application NO. 2005/0205903. In this CMOS image sensor, a photoelectric conversion film is used as a photoelectric conversion unit.

SUMMARY OF THE INVENTION

The present invention provides a CMOS image sensor that uses a thiophene derivative, which is stable with moisture and oxygen, as a photoelectric conversion unit formed on a surface of the CMOS image sensor.

According to an aspect of the present invention, there is provided a CMOS image sensor comprising first through third photoelectric conversion units sequentially formed on a semiconductor substrate, in which the first through third photoelectric conversion units are vertically stacked with predetermined depths respectively, wherein the first photoelectric conversion unit detects blue light and comprises: a first electrode; a second electrode; and a p-type thiophene derivative layer between the first electrode and the second electrode.

The p-type thiophene derivative layer may be pentathiophene.

The first photoelectric conversion unit may further comprise an n-type thiophene derivative layer between the p-type thiophene derivative layer and the second electrode.

The n-type thiophene derivative layer may be formed of perfluoropentathiophene.

The first photoelectric conversion unit may further comprise an electron blocking layer between the first electrode and the p-type thiophene derivative layer.

The electron blocking layer may be formed of tri(1-phenylpyrazolato)iridium (Ir(ppz)$_3$).

The first photoelectric conversion unit may further comprise a hole blocking layer between the second electrode and the n-type thiophene derivative layer.

The hole blocking layer may be formed of bathocuproine (BCP) or 3-phenyl-4-(1'-naphthyl)-5-phenyl-1,2,4-triazole (TAZ).

The CMOS image sensor may further comprise an intrinsic layer in which a p-type thiophene derivative and an n-type thiophene derivative are co-deposited between the p-type thiophene derivative layer and the n-type thiophene derivative layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A vertically-stacked complimentary metal oxide semiconductor (CMOS) image sensor and a method of manufacturing the same according to the present invention will now be described more fully with reference to the accompanying drawings in which exemplary embodiments of the invention are shown.

Figure 1:
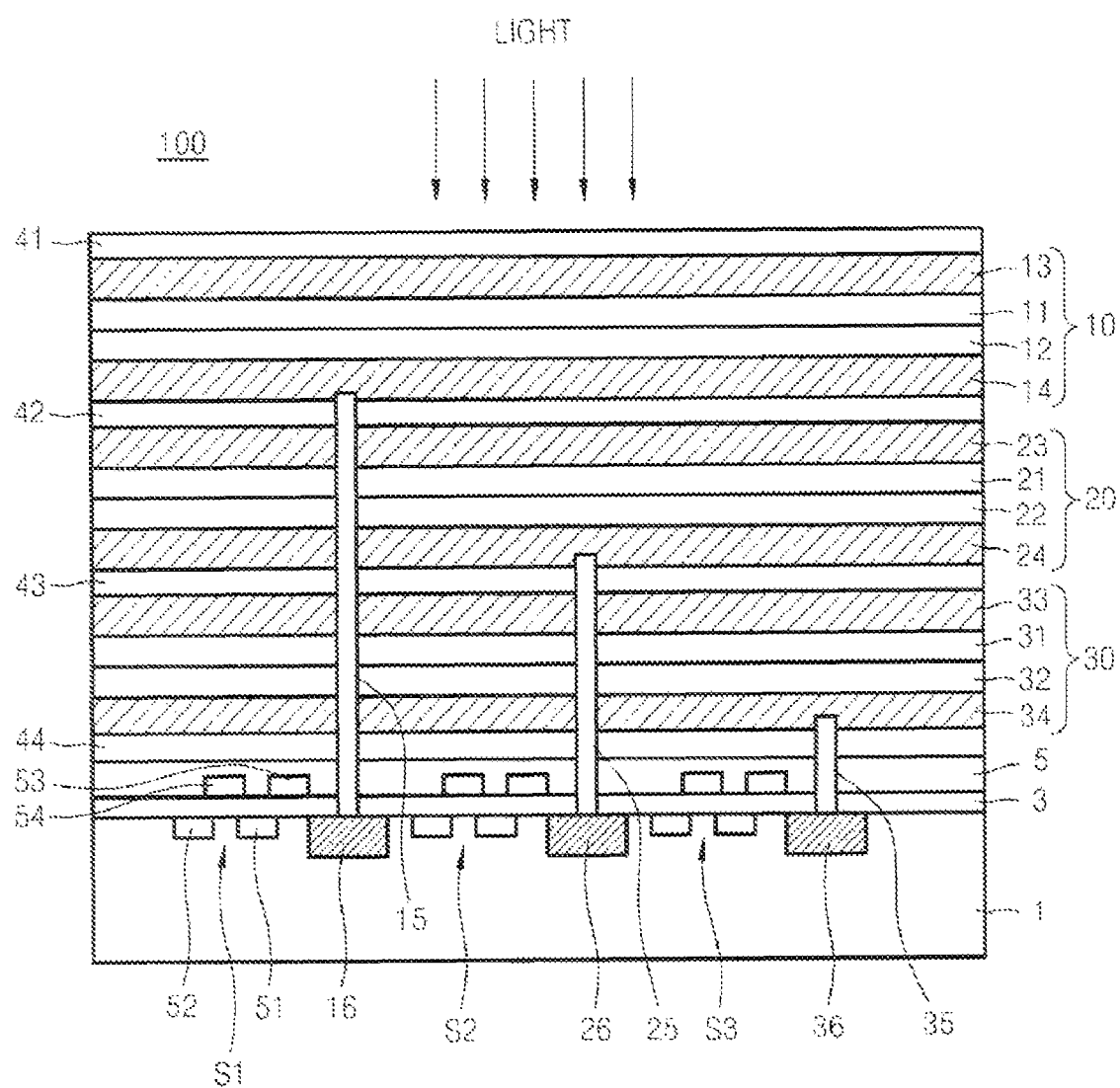
FIG. 1 is a cross-sectional view of a CMOS image sensor having thiophene derivatives according to an embodiment of the present invention.

FIG. 1 is a cross-sectional view of a vertical CMOS image sensor 100 having thiophene derivatives, according to an embodiment of the present invention.

Referring to FIG. 1, the vertically-stacked CMOS image sensor 100 according to the current embodiment of the present invention includes first through third photoelectric conversion units 10, 20, and 30 vertically and sequentially stacked on a semiconductor substrate 1. A transparent insulating layer 41 is formed on an upper surface of the first photoelectric conversion unit 10, a transparent insulating layer 44 is formed on a lower surface of the third photoelectric conversion unit 30, and transparent insulating layers 42 and 43 are respectively formed between the first and second photoelectric conversion units 10 and 20 and between the second and third photoelectric conversion units 20 and 30. A CMOS circuit unit (not shown) is formed on the lower surface of the third photoelectric conversion unit 30 to generate a current by receiving charges from the first through third photoelectric conversion units 10, 20, and 30.

The first photoelectric conversion unit 10 mainly absorbs blue light having short wavelengths, the second photoelectric conversion unit 20 mainly absorbs green light, and the third photoelectric conversion unit 30 mainly absorbs red light.

The first photoelectric conversion unit 10 may include a first electrode 13 and a second electrode 14, and a p-type thiophene derivative layer 11 and an n-type thiophene derivative layer 12 between the first electrode 13 and the second electrode 14. The p-type thiophene derivative layer 11 and the n-type thiophene derivative layer 12 form a P-N hetero junction. The first and second electrodes 13 and 14 may be formed of a material that may transmit light. For example, the first and second electrodes 13 and 14 may be formed of indium tin oxide (ITO), Au, Ag, or Al.

The p-type thiophene derivative layer 11 may be formed of a conductive organic material that is very stable in moisture and oxygen and has p-type semiconductor characteristics. In this regard, the p-type thiophene derivative layer 11 may be formed of pentathiophene.

An example of the p-type thiophene derivative layer 11 may be a compound represented by Chemical Formula 1 as follows.

[Chemical Formula 1]

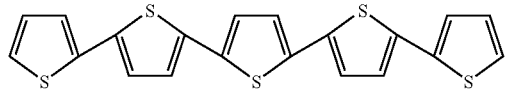

Figure 2:
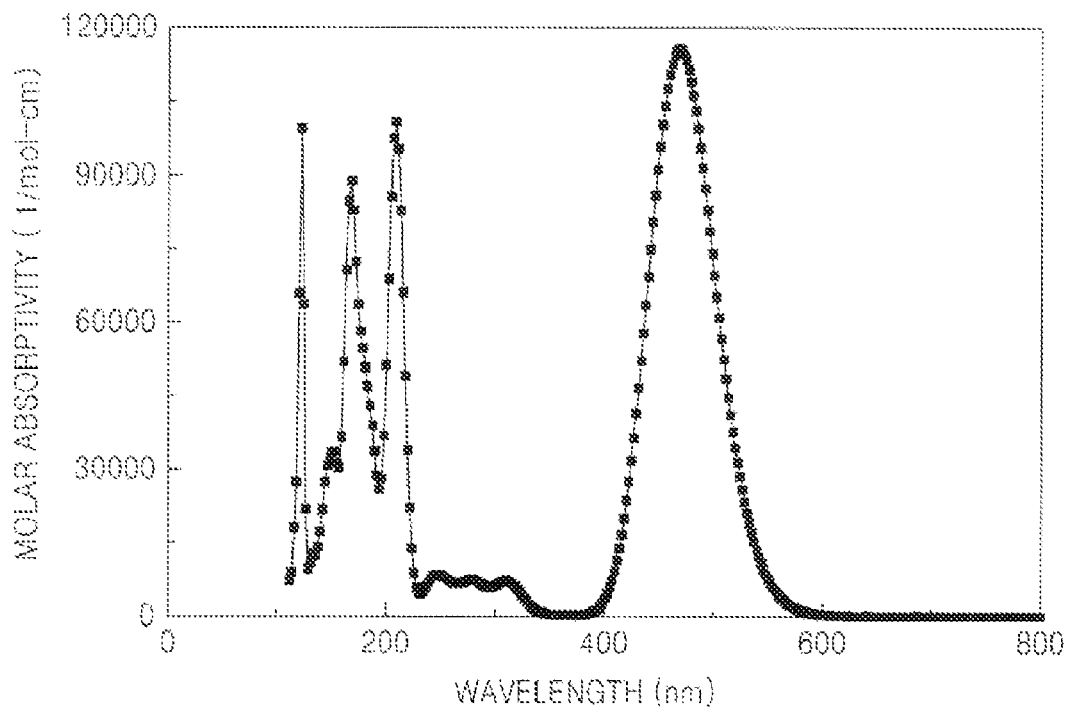
FIG. 2 is a graph illustrating optical absorption characteristics of pentathiophene.

FIG. 2 is a graph illustrating optical absorption characteristics of pentathiophene. Referring to FIG. 2, the pentathiophene absorbs blue light having a wavelength of approximately 450 nm, and transmits green light and red light. The pentathiophene generates electron-hole pairs by absorbing light.

The n-type thiophene derivative layer 12 is formed of a conductive organic material and has n-type semiconductor characteristics. In this regard, the n-type thiophene derivative layer 12 may be formed of perfluoropentathiophene.

An example of the perfluoropentathiophene may be represented by Chemical Formula 2 as follows.

[Chemical Formula 2]

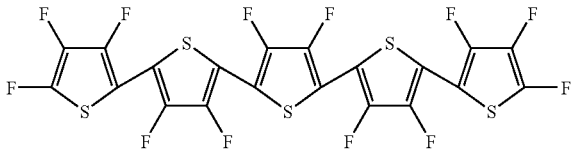

Figure 3:
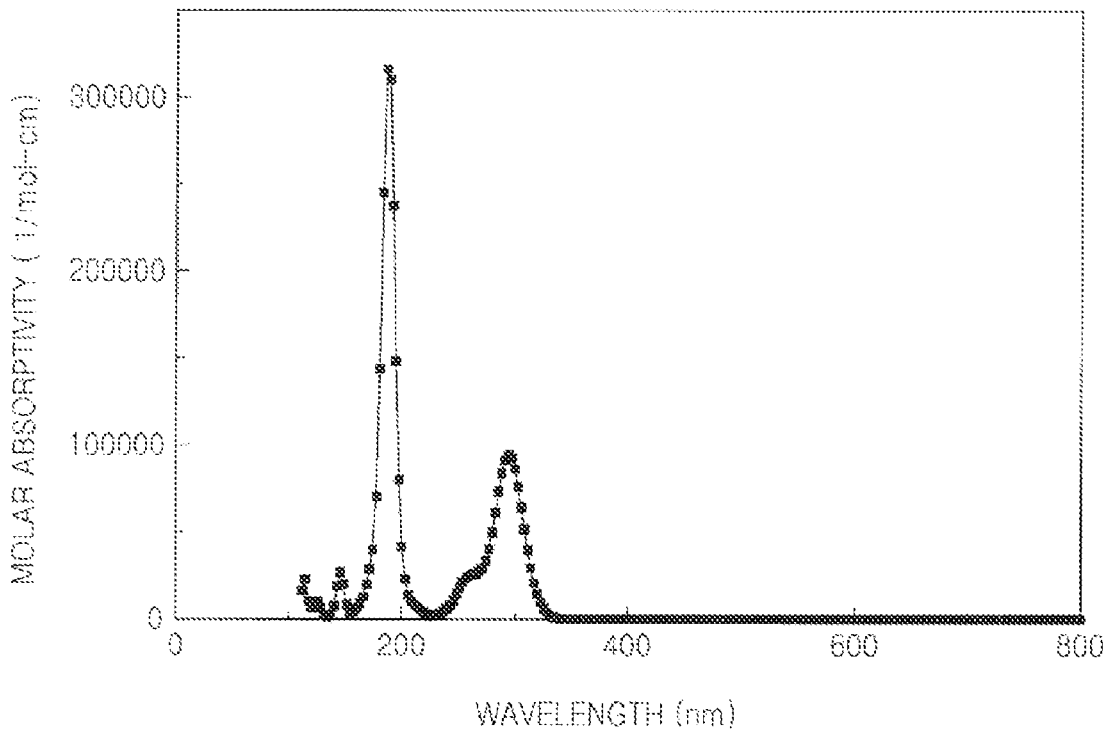
FIG. 3 is a graph illustrating optical absorption characteristics of perfluoropentathiophene.

FIG. 3 is a graph illustrating optical absorption characteristics of perfluoropentathiophene. Referring to FIG. 3, the perfluoropentathiophene does not absorb visible light, and thus, the blue light is absorbed in the p-type thiophene derivative layer 11, and the light of remaining wavelengths is transmitted to the second photoelectric conversion unit 20. The n-type thiophene derivative layer 12 may be used as a moving path of electrons generated from the p-type thiophene derivative layer 11.

When light is incident on the first electrode 13 in a state in which a negative voltage is applied to the first electrode 13 and a positive voltage is applied to the second electrode 14, the p-type thiophene derivative layer 11 generates electron-hole pairs by absorbing blue light. At this point, electrons are transmitted through the n-type thiophene derivative layer 12 to the second electrode 14.

Meanwhile, perfluoro alkyl group substituted pentathiophene, in which a fluorinated alkyl group is combined at ends of a chemical formula as shown in Chemical Formulas 3 through 5 below, may be used to form the n-type thiophene derivative layer 12 since the perfluoro alkyl group substituted pentathiophene is an n-type thiophene derivative, and as well as absorbs blue light and transmits green light and red light.

[Chemical Formula 3]

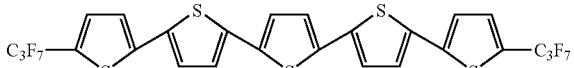

[Chemical Formula 4]

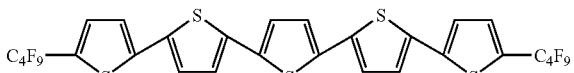

[Chemical Formula 5]

Referring again to FIG. 1, the second photoelectric conversion unit 20 may include a third electrode 23 and a fourth electrode 24, and a p-type N,N'-dimethylquinacridone layer 21 and an n-type tris-8-hydroxyquinoline aluminum (Alq3) layer 22 formed between the third electrode 23 and the fourth electrode 24.

Each of the third electrode 23 and the fourth electrode 24 may be formed of a transparent material that may transmit light, for example, ITO, Au, Ag, or Al.

The p-type N,N'-dimethylquinacridone layer 21 and the n-type Alq3 layer 22 form a P-N hetero junction. In a state in which a negative voltage is applied to the third electrode 23 and a positive voltage is applied to the fourth electrode 24, the p-type N,N'-dimethylquinacridone layer 21 is excited by green light of the incident light, and thus, generates electron-hole pairs, wherein the electrons are transmitted to the fourth electrode 24 through the n-type Alq3 layer 22.

The third photoelectric conversion unit 30 may include a fifth electrode 33 and a sixth electrode 34, and p-type zinc phthalocyanine (ZnPc) layer 31 and an n-type Alq3(tris-8-hydroxyquinoline aluminum) layer 32 between the fifth electrode 33 and the sixth electrode 34.

Each of the fifth electrode 33 and the sixth electrode 34 may be formed of a material that may transmit light.

The p-type ZnPc layer 31 and the n-type Alq3 layer 32 form a P-N hetero junction. In a state in which a negative voltage is applied to the fifth electrode 33 and a positive voltage is applied to the sixth electrode 34, the p-type ZnPc layer 31 is excited by red light of the incident light, and thus, generates electron-hole pairs. At this point, electrons are transmitted to the sixth electrode 34 through the n-type Alq3 layer 32.

The CMOS circuit unit (not shown) includes first through third signal processing regions S1, S2, and S3 formed in the semiconductor substrate 1. The semiconductor substrate 1 may be a p-type silicon substrate.

The first signal processing region S1 includes a doped region 16 which is connected to the second electrode 14 of the first photoelectric conversion unit 10 through an electrode wire 15, and a floating diffusion region 51 and a reset region 52 that are formed on a side of the doped region 16. The doped region 16, the floating diffusion region 51, and the reset region 52 may be n+ type doped regions.

An insulating layer 3 is formed on the semiconductor substrate 1, and a p-type silicon layer 5 is formed on the insulating layer 3. A transfer gate 53 is formed between the doped region 16 and the floating diffusion region 51 in the p-type silicon layer 5, and together, the doped region 16, the floating diffusion region 51, and the transfer gate 53 constitute a transfer transistor.

In the p-type silicon layer 5, a reset gate 54 is formed between the floating diffusion region 51 and the reset region 52, and the floating diffusion region 51, the reset region 52, and the reset gate 54 constitute a reset transistor. Although not shown in FIG. 2, a drive transistor and a selection transistor may further be included on a side of the doped region 16 as signal processing devices.

The configurations of the second and third signal processing regions S2 and S3 are substantially identical to the first signal processing region S1, and thus, the detailed description thereof will not be repeated.

The electrode wire 15 is formed to electrically connect the doped region 16 to the second electrode 14, however, is formed to be insulated from the third through sixth electrodes 23, 24, 33, and 34. Although not shown in FIG. 1, a via hole may be formed between the second electrode 14 and the doped region 16, an insulating spacer may be formed on a side of the via hole, and the electrode wire 15 may be formed to pass through the spacer. Electrode wires 25 and 35 respectively connect the fourth electrode 24 to a doped region 26 and the sixth electrode 34 to a doped region 36. In this regard, the structure of the electrode wires 25 and 35 may be formed identical to the structure of the electrode wire 15, and thus the detailed description thereof will not be repeated.

Figure 4:
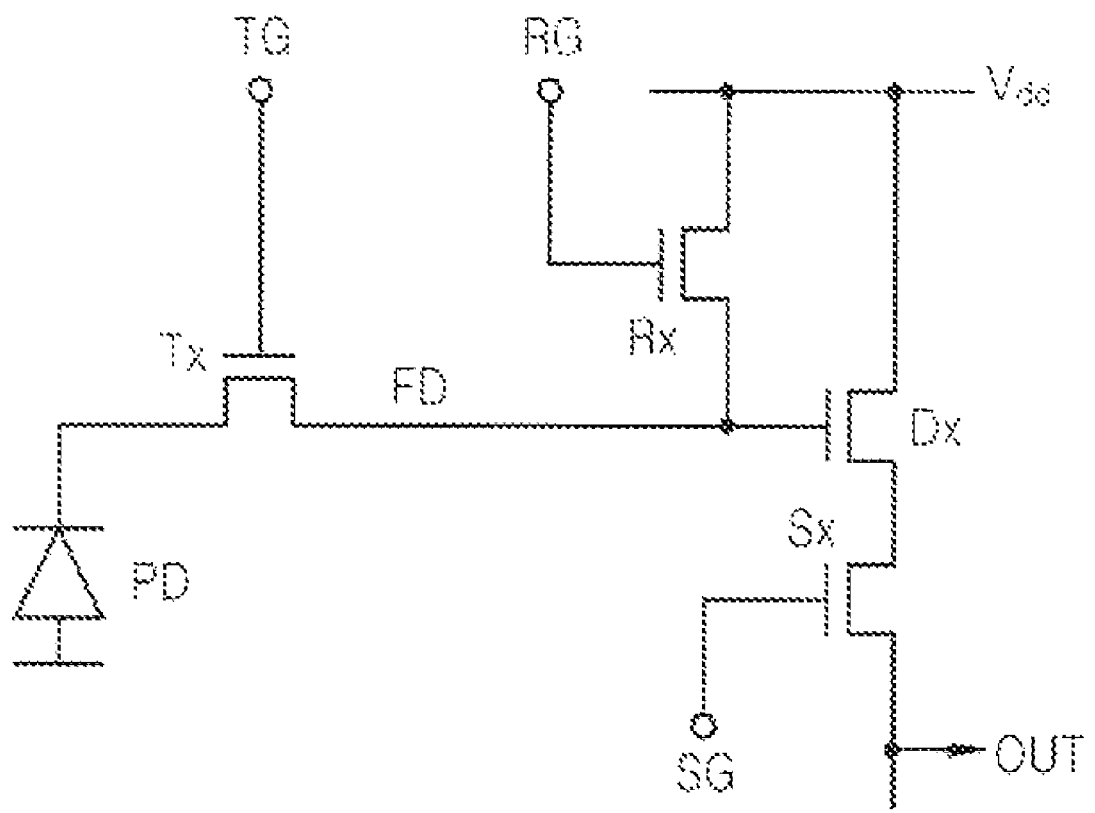
FIG. 4 is an equivalent circuit diagram of a blue pixel of the CMOS image sensor, according to an embodiment of the present invention.

FIG. 4 is an equivalent circuit diagram of a blue pixel of the CMOS image sensor 100 according to an embodiment of the present invention. Such equivalent circuit diagram may also be applied to a green pixel and a red pixel, which are unit pixels of the CMOS image sensor 100. Referring to FIG. 4, the blue pixel of the CMOS image sensor 100 includes a first photoelectric conversion unit PD, a transfer transistor Tx, a reset transistor Rx, a drive transistor Dx, and a selection transistor Sx.

When light is irradiated onto the first photoelectric conversion unit PD in a state in which a direct current (DC) voltage is applied to the first photoelectric conversion unit PD, electrons are generated by the first photoelectric conversion unit PD. The electrons are collected in the doped region 16 via the second electrode 14 and the electrode wire 15. The transfer transistor Tx may control the transmission of the electrons to a floating diffusion region FD of the blue pixel with a transfer gate line signal TG. The reset transistor Rx may reset voltage of the floating diffusion region FD by controlling an input power source Vdd with a reset gate line signal RG. The drive transistor Dx may perform as a source follower amplifier. The selection transistor Sx is a switching device that may select a unit pixel with a selection gate line signal SG. The voltage of the input power source Vdd may be output via the output line OUT through the drive transistor Dx and the selection transistor Sx.

The configurations and operations of the second and third signal processing regions S2 and S3 are substantially identical to the first signal processing region S1, and thus, the detailed description thereof will not be repeated.

The CMOS image sensor 100 according to the current embodiment of the present invention may be realized without an additional color filter or a micro lens, and thus, may be manufactured as a small and simple structure.

The pentathiophene of the region that contacts light is very stable in moisture and oxygen, thereby increasing stability of the CMOS image sensor 100.

Figure 5:
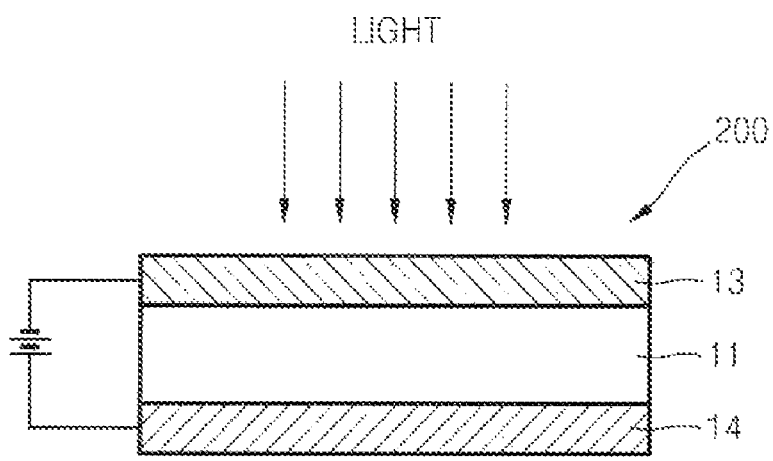
FIG. 5 is a cross-sectional view of a blue photoelectric conversion unit according to an embodiment of the present invention.

FIG. 5 is a cross-sectional view of a blue photoelectric conversion unit 200 according to an embodiment of the present invention. Like reference numerals are used to indicate elements that are substantially identical to the elements of FIG. 1, and thus, the detailed description thereof will not be repeated.

Referring to FIG. 5, the blue photoelectric conversion unit 200 according to the current embodiment of the present invention includes a first electrode 13 and a second electrode 14, and a p-type pentathiophene layer 11 which is a p-type thiophene derivative between the first electrode 13 and the second electrode 14. When light is incident on the first electrode 13 in a state in which a negative voltage is applied to the first electrode 13 and a positive voltage is applied to the second electrode 14, the pentathiophene of the p-type pentathiophene layer 11 generates electrons and holes by absorbing blue light, and the electrons are transmitted to the second electrode 14. Thus, the p-type pentathiophene layer 11 performs a blue photoelectric conversion unit. In this way, if a p-type pentathiophene is used without an n-type material, the manufacturing process may be simplified; however, the capability of detecting blue light may be reduced compared to the blue photoelectric conversion unit 10 of FIG. 1.

Figure 6:
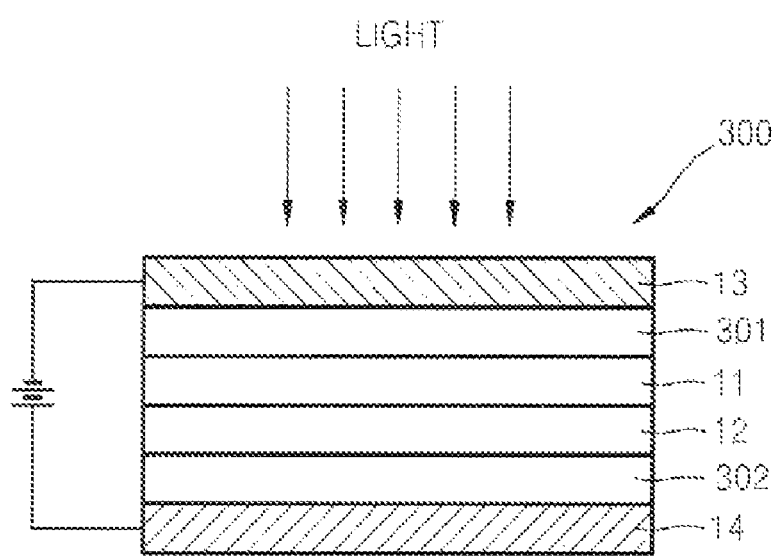
FIG. 6 is a cross-sectional view of a blue photoelectric conversion unit according to another embodiment of the present invention.

FIG. 6 is a cross-sectional view of a blue photoelectric conversion unit 300 according to another embodiment of the present invention. Like reference numerals are used to indicate elements that are substantially identical to the elements of FIG. 1, and thus the detailed description thereof will not be repeated.

Referring to FIG. 6, the blue photoelectric conversion unit 300 according to the current embodiment of the present invention includes an electron blocking layer 301, a p-type pentathiophene layer 11, an n-type perfluoropentathiophene layer 12, and a hole blocking layer 302 sequentially formed between a first electrode 13 and a second electrode 14. When light is incident on the first electrode 13 in a state in which a negative voltage is applied to the first electrode 13 and a positive voltage is applied to the second electrode 14, the p-type pentathiophene layer 11 generates electrons and holes by absorbing blue light, and electrons are transmitted to the second electrode 14 through the hole blocking layer 302. Thus, the blue photoelectric conversion unit 300 performs as a blue photoelectric conversion unit.

The electron blocking layer 301 may be formed to a thickness of 10 to 3000 Å using tri(1-phenylpyrazolato)3 iridium) (Ir(ppz)3), and blocks the electrons from moving to the first electrode 13.

The hole blocking layer 302 may be formed to a thickness of 10 to 3000 Å using bathocuproine (BCP) or 3-phenyl-4-(1'-naphthyl)-5-phenyl-1,2,4-triazole (TAZ), and blocks the holes from moving to the second electrode 14.

The electron blocking layer 301 and the hole blocking layer 302 may also be applied to the blue photoelectric conversion unit 200 of FIG. 5.

Figure 7:
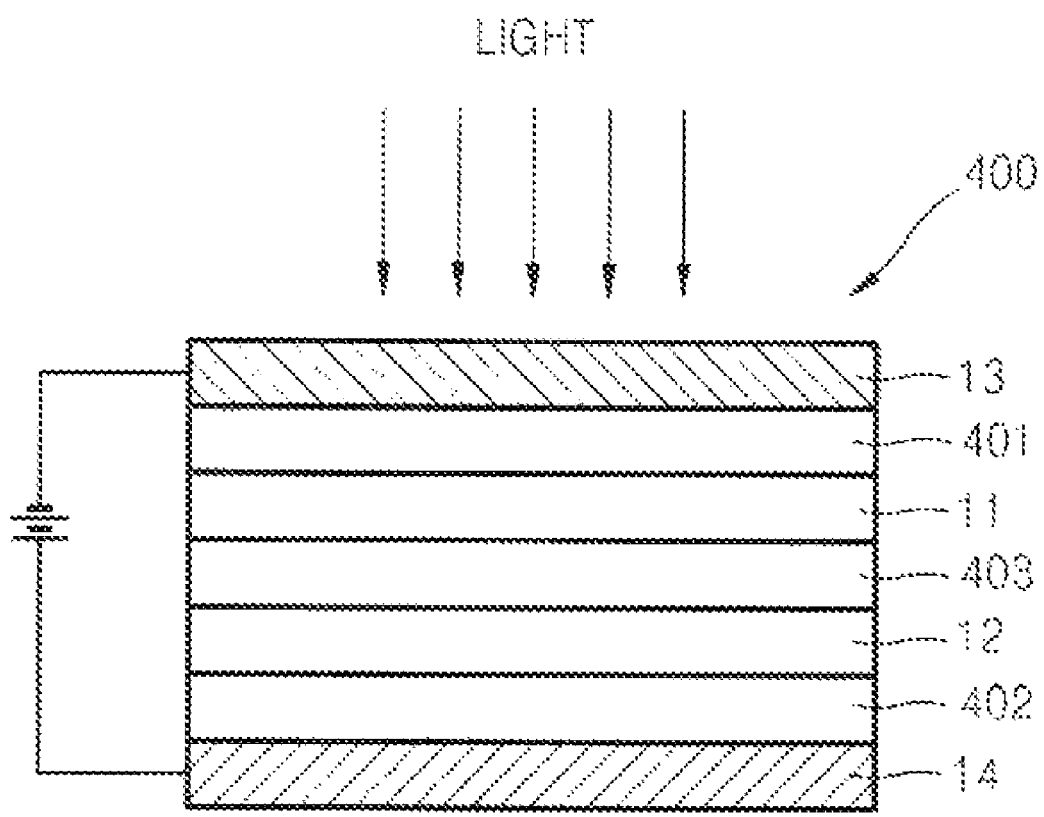
FIG. 7 is a cross-sectional view of a blue photoelectric conversion unit according to still another embodiment of the present invention.

FIG. 7 is a cross-sectional view of a blue photoelectric conversion unit 400 according to another embodiment of the present invention. Like reference numerals are used to indicate elements that are substantially identical to the elements of FIG. 1, and thus the detailed description thereof will not be repeated.

Referring to FIG. 7, the blue photoelectric conversion unit 400 according to the current embodiment of the present invention includes an electron blocking layer 401, a p-type pentathiophene layer 11, an intrinsic layer 403, an n-type perfluoropentathiophene layer 12, and a hole blocking layer 402 sequentially formed between a first electrode 13 and a second electrode 14. The electron blocking layer 401 and the hole blocking layer 402 may be formed of the same material as that of the electron blocking layer 301 and the hole blocking layer 302, respectively.

The intrinsic layer 403 is a layer in which p-type pentathiophene and n-type perfluoropentathiophene are co-deposited.

Together the p-type pentathiophene layer 11, the intrinsic layer 403, and the n-type perfluoropentathiophene layer 12 of the blue photoelectric conversion unit 400 form a P-I-N structure. The P-I-N structure absorbs a larger amount of light than a P-N junction, and electron-hole pairs are generated in the intrinsic layer 403. Thus, the P-I-N structure has a junction boundary region greater than that of a P-N junction, and thus, sensitivity to light may be increased.

When light is incident on the first electrode 13 in a state in which a negative voltage is applied to the first electrode 13 and a positive voltage is applied to the second electrode 14, the p-type pentathiophene layer 11 and the intrinsic layer 403 generate electrons and holes by absorbing blue light. A large amount of electron-hole pairs are formed in the intrinsic layer 403. Electrons are transmitted to the second electrode 14 through the n-type perfluoropentathiophene layer 12 and the hole blocking layer 402. Thus, the blue photoelectric conversion unit 400 performs as a blue photoelectric conversion unit.

In the CMOS image sensor that uses thiophene derivatives according to the present invention, thiophene derivatives which are stable with moisture and oxygen are used in a blue pixel region that comes in contact with air and on which light is incident. Thus, a stable CMOS image sensor may be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A CMOS image sensor comprising first through third photoelectric conversion units sequentially formed on a semiconductor substrate, in which the first through third photoelectric FW: conversion units are vertically stacked with predetermined depths respectively, wherein
the first photoelectric conversion unit detects blue light and comprises:
a first electrode;
a second electrode; and
a p-type thiophene derivative layer between the first electrode and the second electrode,
wherein the p-type thiophene derivative layer comprises pentathiophene.

2. The CMOS image sensor of claim 1, wherein the first photoelectric conversion unit further comprises an n-type thiophene derivative layer between the p-type thiophene derivative layer and the second electrode.

3. The CMOS image sensor of claim 2, wherein the n-type thiophene derivative layer is formed of perfluoropentathiophene.

4. The CMOS image sensor of claim 2, wherein the first photoelectric conversion unit further comprises an electron blocking layer between the first electrode and the p-type thiophene derivative layer.

5. The CMOS image sensor of claim 4, wherein the electron blocking layer is formed of tri(1-phenylpyrazolato)iridium ($Ir(ppz)_3$).

6. The CMOS image sensor of claim 4, wherein the first photoelectric conversion unit further comprises a hole blocking layer between the second electrode and the n-type thiophene derivative layer.

7. The CMOS image sensor of claim 6, wherein the hole blocking layer is formed of bathocuproine (BCP) or 3-phenyl-4-(1'-naphthyl)-5-phenyl-1,2,4-triazole (TAZ).

8. The CMOS image sensor of claim 6, wherein the first photoelectric conversion unit further comprises an intrinsic layer between the p-type thiophene derivative layer and the n-type thiophene derivative layer, the intrinsic layer being formed by co-depositing a p-type thiophene derivative and an n-type thiophene derivative.

9. The CMOS image sensor of claim 2, wherein the first photoelectric conversion unit further comprises an intrinsic layer between the p-type thiophene derivative layer and the n-type thiophene derivative layer, the intrinsic layer being formed by co-depositing a p-type thiophene derivative and an n-type thiophene derivative .

10. The CMOS image sensor of claim 1, wherein the first photoelectric conversion unit further comprises an electron blocking layer between the p-type thiophene derivative layer and the first electrode and a hole blocking layer between the p-type thiophene derivative layer and the second electrode.

* * * * *